United States Patent [19]

Tarng

[11] 4,343,676

[45] Aug. 10, 1982

[54] ETCHING A SEMICONDUCTOR MATERIAL AND AUTOMATICALLY STOPPING SAME

[75] Inventor: Ming L. Tarng, Mercerville, N.J.

[73] Assignee: RCA Corporation, New York, N.Y.

[21] Appl. No.: 248,035

[22] Filed: Mar. 26, 1981

[51] Int. Cl.³ .................. H01L 21/306; C23F 1/02
[52] U.S. Cl. ................................ 156/628; 148/187; 156/656; 427/85
[58] Field of Search ............... 156/628, 643, 657, 656, 156/659.1, 662; 427/85; 148/174, 179, 180, 187, 189

[56] References Cited

U.S. PATENT DOCUMENTS

| | | | |
|---|---|---|---|
| 3,669,724 | 6/1972 | Brand | 117/106 |
| 3,785,862 | 1/1974 | Grill | 117/217 |
| 3,847,776 | 11/1974 | Bourdon et al. | 204/192 |
| 4,057,895 | 11/1977 | Ghezzo | 156/628 X |
| 4,108,715 | 8/1978 | Ishikawa et al. | 156/628 |
| 4,119,992 | 10/1978 | Ipri et al. | 357/4 |

Primary Examiner—William A. Powell
Attorney, Agent, or Firm—Birgit E. Morris; Donald S. Cohen; Robert P. Seitter

[57] ABSTRACT

There is disclosed a method of etching a semiconductor substrate having a region heavily doped with N type impurity atoms spaced from one surface thereof. The one surface of the substrate is masked with an oxide layer or the like and openings are formed in this layer to expose surface areas of the substrate. The substrate is exposed to a refractory metal hexafluoride at elevated temperature whereby the hexafluoride and the exposed substrate material react such that the refractory metal replaces the substrate material until the metal reaches the heavily doped region. This region substantially stops the reaction. Depending on the semiconductor device being made, the refractory metal can then be etched in an etchant that does not react with the semiconductor material to form a moat of uniform depth, or it can be left in place.

10 Claims, 3 Drawing Figures

ETCHING A SEMICONDUCTOR MATERIAL AND AUTOMATICALLY STOPPING SAME

BACKGROUND OF THE INVENTION

This invention relates to etching and, more particularly, to chemical etching semiconductor material so that the etching automatically stops at a predetermined location.

In the manufacture of semiconductor devices, it is often necessary to etch some of the semiconductor material away. For example, when manufacturing high voltage power devices, it is often necessary to form a mesa or a moat to expose the edge of a PN junction. The surface of the mesa or the moat is normally covered with a passivation material to maximize the surface breakdown voltage of the device, to minimize its leakage current and to maximize its surface stability.

Etching these configurations involves the formation of an oxide, typically silicon dioxide ($SiO_2$), on the surface to be etched and then selectively removing the oxide to expose the area to be etched. Typically, oxide removal is done in accordance with photolithographic techniques generally well known in the art. After the oxide has been removed, the semiconductor material is exposed to an etchant to remove that material adjacent the openings. When this conventional technique is used, several failure modes are common. First, it is not unusual to etch to a non-uniform depth resulting in the loss of semiconductor product. A conventional etchant, known in the art as a FAN etch, comprises a solution of hydrofluoric (HF), acetic ($CH_3COOH$) and nitric ($HNO_3$) acids. Because the FAN etch is so strong, it is usual to leave the photoresist material in place over the oxide to protect those areas of the material which are not to be etched. If there is any imperfection in the photoresist or the oxide the FAN etch can attack the underlying silicon resulting in the loss of semiconductor product.

SUMMARY OF THE INVENTION

This invention provides a method of etching semiconductor material wherein the etching automatically terminates at a predetermined location. In accordance with another aspect of this invention, photoresist and oxide failures are minimized.

In accordance with this invention, a substrate of semiconductor material is provided with a first region adjacent one surface and a second region spaced from that surface doped with a heavy concentration of N type impurity atoms. The surface is masked, preferably with a layer of oxide or similar material, and openings are formed in that layer to expose surface areas of semiconductor material that are to be etched. Thereafter, the substrate is exposed to a gaseous refractory metal hexafluoride, preferably tungsten or molybdenum hexafluoride, at an elevated temperature, preferably of at least about 550° C., for a period of time sufficient to replace the semiconductor material in the first region with the refractory metal from the hexafluoride. The heavy doping in the second region stops the reaction between the hexafluoride and the semiconductor material. Depending on the device being formed, the refractory metal is etched in an etchant that reacts with and removes the metal while not substantially reacting with the semiconductor material.

DETAILED DESCRIPTION OF A PREFERRED EMBODIMENT

Figure 1:
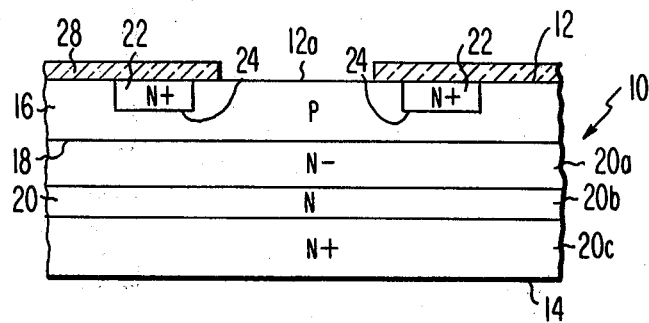
FIGS. 1-3 illustrate in section view with a greatly exaggerated scale for the sake of clarity, a semiconductor wafer at various stages in a method of forming a moat in accordance with this invention.

In the drawing, there is disclosed a substrate in the form of a wafer 10 of semiconductor material, for example, silicon, having first and second generally parallel surfaces 12 and 14. It should be understood that in processing such wafers, a plurality of semiconductor devices are formed on a single wafer, but for the sake of clarity manufacture of two devices is illustrated. As illustrated in FIG. 1 of the drawing, the wafer 10 has been processed in accordance with any suitable technique to form a plurality of transistors. Thus, the wafer 10 includes a region 16 doped with P type impurity atoms, for example, boron atoms, extending inwardly from the surface 12 where it forms a PN junction 18 with a region 20 doped with impurity atoms of the N type extending inwardly from the surface 14. The N type dopant in the region 20 is preferably phosphorus, although the dopant could comprise antimony (Sb) or arsenic (As). The N doped region 20 actually comprises a first sub-region 20a lightly doped with the N type impurity atoms, for example, with a dopant concentration of about $10^{14}$ atoms/$cm^3$; adjacent the sub-region 20a is a second sub-region 20b doped with impurity atoms with a concentration of about $10^{16}$ atoms/$cm^3$; and, extending from the second sub-region to the surface 14 is a third heavily doped sub-region 20c having a concentration of impurity atoms of at least about $10^{19}$ atoms/$cm^3$.

Extending into the P type region 16 are a plurality of regions 22 heavily doped with N type impurity atoms. The regions 22 extend inwardly from the first surface 12 to form PN junctions 24 with the P type region 16. The regions 22 function as the emitters of the transistors being formed, the P type region 16 functions as the base and the N type region 20 functions as the collector. As clearly illustrated in FIG. 3 of the drawing, a moat 26 is formed around each transistor device to expose the base collector PN junction 18. Once the moat 26 is formed, it is filled with a suitable passivation material (not illustrated) such as glass to maximize the surface breakdown voltage of the device, to minimize its leakage currents and to maximize the surface stability thereof.

Before completing the description of a preferred embodiment of this invention, certain chemical reactions should be understood. It was known prior to this invention that certain gaseous refractory metal fluoride compounds, e.g., tungsten hexafluoride ($WF_6$) and molybdenum hexafluoride ($MoF_6$), react at relatively high temperatures with semiconductor material, e.g., silicon (Si), such that the silicon combines with the fluoride and the metal precipitates out. For example, if tungsten hexafluoride is exposed to a silicon wafer at a temperature in excess of about 400° C., the following reaction occurs on the wafer surface:

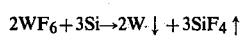

Normally this reaction stops after a few hundred to about 2,000 Angstroms of tungsten are deposited on the wafer surface.

In accordance with this invention, it has been found that if a silicon wafer is covered with a suitable masking material such as silicon oxide or a silicon nitride and a window is formed in it to expose a surface area of the wafer and if the wafer is exposed to tungsten hexafluoride at temperatures in excess of about 550° C., the above chemical reaction will continue indefinitely and extend into the body of the silicon wafer adjacent the exposed surface area. The reason for this is not completely understood, but is believed to be caused by stress on the silicon surface near the periphery of the window in the mask. This stress results from several factors including the internal stress developed when a film is formed on a substrate and thermal stress acting as a result of the difference in the linear coefficient of thermal expansion between the silicon and the mask. For example, the linear coefficient of silicon ($2.5 \times 10^{-6}$ per degrees centrigrade) is about five times greater than that of silicon dioxide ($0.5 \times 10^{-6}$ per degrees centigrade). It may be that this stress opens pores in the tungsten that allow the tungsten hexafluoride to diffuse deep into the wafer body. Moreover, it has been found that this reaction will be significantly retarded so that it is substantially non-existent if the silicon wafer is heavily doped with N type impurity atoms. A doping of the silicon with a phosphorus concentration of at least about $10^{19}$ atoms/cm$^3$ has stopped the above reaction.

Figure 2:
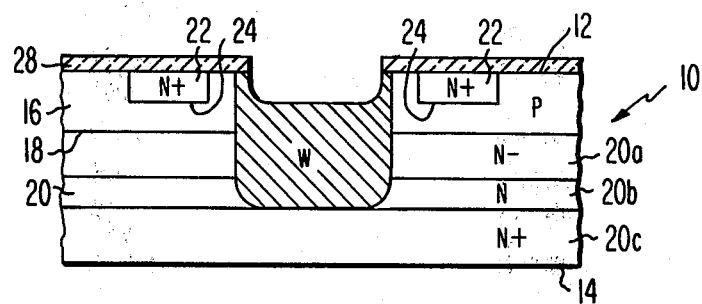

Thus in accordance with this invention after, the wafer 10 has been processed to include the regions 16, 18 and 20, the surface 12 is covered with a layer 28 of a masking material, preferably silicon dioxide (SiO$_2$) thermally grown or otherwise deposited. Other masking materials, e.g. silicon nitride (Si$_3$N$_4$), can be utilized so long as they induce the stress believed to enhance the above chemical reaction. The oxide layer 28 is formed with windows to exposed surface areas 12a where the moats 26 are to be formed and the wafer 10 is exposed to a gaseous refractory metal fluoride compound at an elevated temperature so that the silicon atoms at and adjacent the surface areas 12a are replaced with the metal atoms. Preferably, tungsten hexafluoride is fed into a chemical vapor deposition (CVD) reactor containing the wafer 10 heated to a temperature of from about 550° C. to about 800° C. As explained above, the silicon atoms are replaced by tungsten atoms as shown in FIG. 2 of the drawing. The wafer is retained in the CVD reactor for a period of time sufficient to substitute the tungsten atoms for the silicon in the P region 16, and the N sub-regions 20a and 20b. When the reaction reaches the heavily doped sub-region 20c, it substantially stops. The length of time that the wafer 10 is retained in the CVD reactor varies depending upon the depth of the regions 16, 20a and 20b. A typical time for depositing a 5 micron layer is approximately 14 minutes although it is contemplated that times ranging from 1 to 100 minutes may be needed depending on the various depths.

It can be seen in FIG. 2 that the tungsten surface within the area of the window is slightly depressed relative to the original surface 12a. This is primarily because only two tungsten atoms replace three of the slightly larger silicon atoms. It can also be seen in FIG. 2 that the reaction extends laterally a slight distance, so that it underlies the masking layer 28.

At this point, it is noted that in some instances it may be desirable to deposit a refractory metal into the surface of a semiconductor substrate, e.g. it may be desirable to deposit the metal as a conductor or as a contact to a heavily doped N region. In these instances, the metal would be left in place and further processing of the device would continue.

Figure 3:
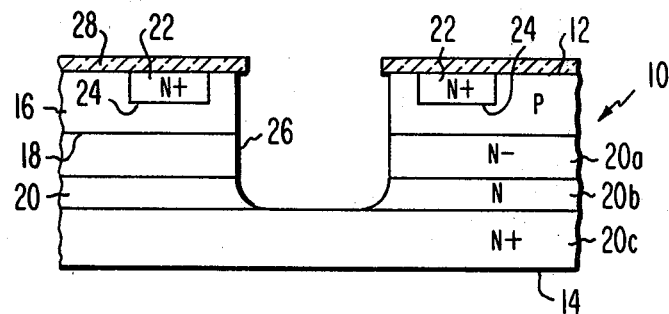

Continuing with the description of forming a moat, after the silicon material has been replaced with the tungsten as illustrated in FIG. 2, the wafer 10 is now etched to remove the tungsten and form the moat 26 as illustrated in FIG. 3. Preferably, the etchant used reacts with tungsten but does not substantially etch the masking material or the silicon. An example of such an etchant is a solution of potassium hydroxide (KOH) and potassium ferricyanide (K$_3$Fe(CN)$_6$) in a ratio of 1 to 1. This etch is preferably done at a temperature of about 40° C. Such an etchant readily attacks and removes the tungsten material while leaving the silicon and silicon dioxide material substantially intact.

The moat 26 thus formed will have a substantially uniform depth and width since the tungsten will not react with the heavily doped N region 20C and since the etchant will not attack the silicon. Moreover, no photoresist or oxide failures can occur since the etchant will not attack the oxide and since the photoresist has previously been removed.

EXAMPLE

A silicon wafer was doped with phosphorus atoms to include a lightly doped region adjacent one surface and a heavily doped region adjacent the opposite surface. The heavily doped region included a phosphorus atom concentration of about $10^{19}$ atoms/cm$^3$ and formed a junction with the more lightly doped region intermediate the surfaces of the wafer. A layer of silicon dioxide (SiO$_2$) was thermally grown on the one surface of the wafer and windows were formed therein by conventional photolithographic techniques to expose surface areas of the silicon.

The wafer was placed in an atmospheric pressure chemical vapor deposition (APCVD) reactor which was pumped down to a vacuum and then backfilled with argon (Ar) to a pressure just slightly greater than atmospheric. The reactor chamber was then heated to a temperature of approximately 700° C. and tungsten hexafluoride in a carrier gas of argon was then fed into the reactor chamber. The argon was fed at the rate of 3 liters/minute and the tungsten hexafluoride at the rate of 30 cc/minute. The tungsten hexafluoride was pulsed into the chamber. Each pulse lasted for 20 seconds with the time between pulses being 40 seconds. After fourteen pulses the wafer was cooled and removed from the chamber.

The wafers were then etched in a solution of potassium hydroxide and potassium ferricyanide in a 1 to 1 ratio at 40° C. Moats approximately 70 microns wide and 5 microns deep were formed. Each moat had a uniform depth and extended to the junction between the heavy and more lightly doped regions.

Completing the detailed description of a preferred method, the wafer 10 is ready for further processing. The moat 26 is now filled with passivation material, the devices are now separated from each other and each device is packaged, all in accordance with generally conventional techniques.

I claim:

1. A method of etching material from one surface of a silicon substrate formed with a first region adjacent said one surface and a second region spaced from said one surface, said second region being doped with N type impurity atoms in a concentration high enough to significantly retard a chemical reaction between the silicon and a refractory metal hexafluoride, said method comprising:

masking said one of said surfaces to expose a surface area of said substrate where said silicon is to be etched;

exposing said substrate to a gaseous refractory metal hexafluoride at a temperature of at least about 550° C. whereby said hexafluoride reacts with the silicon in said first region to replace the silicon with the refractory metal of said hexafluoride, and maintaining said reaction until all of the silicon in said first region has been replaced with the refractory metal of said hexafluoride; and etching said refractory metal from said first region of said substrate with an etchant that does not substantially react with the semiconductor material.

2. A method in accordance with claim 1 wherein said second region is doped with phosphorus atoms in a concentration of at least about $10^{19}$ atoms/cm$^3$.

3. A method in accordance with claim 1 wherein said one of said surfaces is masked with an oxide.

4. A method in accordance with claim 1 wherein said one of said surfaces is masked with silicon nitride.

5. A method in accordance with claims 1 or 2 wherein said substrate is exposed to a refractory metal hexafluoride selected from the group consisting of tungsten hexafluoride and molybdenum hexafluoride.

6. A method in accordance with claims 1 or 2 wherein said substrate is exposed to tungsten hexafluoride.

7. A method in accordance with claim 1 wherein said refractory metal is etched from said first region of said substrate with a solution including potassium hydroxide.

8. A method in accordance with claim 7 wherein said solution further includes potassium ferricyanide.

9. A method of etching material from one surface of a silicon substrate formed with a first region adjacent said one surface and a second region spaced from said one surface doped with phosphorus atoms in a concentration of at least about $10^{19}$ atoms/cm$^3$, said method comprising:

forming an oxide mask on said one surface to expose a surface area of said substrate where said silicon is to be etched; and raising the temperature of said substrate to a temperature of at least about 550° C. and exposing it to a refractory metal hexafluoride selected from the group consisting of tungsten hexafluoride and molybdenum hexafluoride for a period of time sufficient for the refractory metal of said hexafluoride to replace the silicon atoms in said first region of said substrate whereupon the reaction between said hexafluoride and said silicon stops at said second region.

10. A method in accordance with claim 9 further comprising:

etching said refractory metal from said first region with an etchant that does not substantially react with silicon.

* * * * *